(12) United States Patent
Crotty, Jr. et al.

(10) Patent No.: US 10,893,636 B2
(45) Date of Patent: Jan. 12, 2021

(54) METHOD FOR FORMING A PICKUP AREA OF A BOARD LEVEL SHIELD

(71) Applicant: Laird Technologies, Inc., Chesterfield, MO (US)

(72) Inventors: Paul W. Crotty, Jr., East Stroundsburg, PA (US); Joseph H. Aubin, Hollis, NH (US); Zbigniew M. Korus, Palatine, IL (US); Brian J. Donahue, DeKalb, IL (US); Kenneth M. Robinson, Effort, PA (US)

(73) Assignee: Laird Technologies Inc., Chesterield, MO (US)

( * ) Notice: Subject to any disclaimer, the term of this patent is extended or adjusted under 35 U.S.C. 154(b) by 332 days.

(21) Appl. No.: 15/914,271

(22) Filed: Mar. 7, 2018

(65) Prior Publication Data

US 2018/0263144 A1    Sep. 13, 2018

Related U.S. Application Data

(60) Provisional application No. 62/615,320, filed on Jan. 9, 2018, provisional application No. 62/469,978, filed on Mar. 10, 2017.

(51) Int. Cl.
*H05K 9/00* (2006.01)
*G06F 1/18* (2006.01)

(52) U.S. Cl.
CPC ......... *H05K 9/0032* (2013.01); *H05K 9/0024* (2013.01); *H05K 9/0026* (2013.01); *H05K 9/0081* (2013.01); *G06F 1/182* (2013.01); *H05K 2201/10371* (2013.01)

(58) Field of Classification Search
CPC .. H05K 9/0024; H05K 9/0026; H05K 9/0032; H05K 9/0081; H05K 2201/10371; G06F 1/182
See application file for complete search history.

(56) References Cited

U.S. PATENT DOCUMENTS

| | | | |
|---|---|---|---|
| 5,614,694 A * | 3/1997 | Gorenz, Jr. .......... | H05K 9/0026 174/375 |
| 5,895,884 A | 4/1999 | Davidson | |
| 6,384,324 B2 * | 5/2002 | Flegeo ................. | H05K 9/0032 174/390 |
| 6,445,583 B1 * | 9/2002 | Kline .................. | H01L 23/3675 165/80.3 |
| 6,678,170 B2 * | 1/2004 | Barringer ............ | H05K 9/0062 174/135 |
| 7,488,902 B2 | 2/2009 | English et al. | |
| 7,504,592 B1 | 3/2009 | Crotty, Jr. | |

(Continued)

FOREIGN PATENT DOCUMENTS

JP    2008034713 A    2/2008

*Primary Examiner* — Peter Dungba Vo
*Assistant Examiner* — Jeffrey T Carley
(74) *Attorney, Agent, or Firm* — Harness, Dickey & Pierce, P.L.C.; Anthony G. Fussner

(57) ABSTRACT

A method includes raising a pickup area of a pickup member including one or more arms extending between the pickup area and one or more sidewalls of a frame of a board level shield (BLS), such that the pickup area is raised relative to and above an upper surface of the one or more sidewalls of the frame, and such that the pickup area rotates in place as the pickup area is raised relative to and above the upper surface of the one or more sidewalls.

19 Claims, 7 Drawing Sheets

(56) References Cited

U.S. PATENT DOCUMENTS

| | | | |
|---|---|---|---|
| 7,926,166 B2 | 4/2011 | Zuehlsdorf et al. | |
| 2001/0052521 A1 | 12/2001 | Goyal et al. | |
| 2002/0014345 A1* | 2/2002 | Flegeo | H05K 9/0032 |
| | | | 174/350 |
| 2008/0062668 A1 | 3/2008 | Kakinoki et al. | |
| 2008/0158849 A1* | 7/2008 | Gallahan | H05K 9/0032 |
| | | | 361/818 |
| 2012/0193136 A1* | 8/2012 | Vinokur | H05K 9/0032 |
| | | | 174/377 |
| 2012/0298414 A1* | 11/2012 | Park | H05K 9/0032 |
| | | | 174/382 |
| 2013/0033843 A1* | 2/2013 | Crotty, Jr. | H05K 9/0032 |
| | | | 361/807 |
| 2014/0218851 A1* | 8/2014 | Klein | G06F 1/182 |
| | | | 361/679.02 |
| 2017/0171961 A1* | 6/2017 | Ball | H05K 9/0032 |
| 2017/0223822 A1* | 8/2017 | Xu | H05K 9/0032 |
| 2018/0115051 A1* | 4/2018 | Nguyen | H01Q 1/38 |

* cited by examiner

US 10,893,636 B2

1

METHOD FOR FORMING A PICKUP AREA OF A BOARD LEVEL SHIELD

CROSS-REFERENCE TO RELATED APPLICATIONS

This application claims priority to and the benefit of U.S. Provisional Patent Application No. 62/469,978 filed Mar. 10, 2017 and U.S. Provisional Patent Application No. 62/615,320 filed Jan. 9, 2018. The entire disclosures of the above applications are incorporated herein by reference.

FIELD

The present disclosure generally relates to board level shield (BLS) frames including pickup members with pickup areas. The pickup member may be configured such that the pickup area is allowed to rotate in place when the pickup member is drawn to raise the pickup area.

BACKGROUND

This section provides background information related to the present disclosure which is not necessarily prior art.

A common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source. For example, board level shields are widely used to protect sensitive electronic devices against inter and intra system electromagnetic interferences and reduce unwanted electromagnetic radiations from a noisy integrated circuit (IC).

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

FIG. 1 is a perspective view of an exemplary embodiment of a frame or fence of a board level shield (BLS) that includes a pick and place bridge (broadly, a pickup member) having a pick and place island (broadly, a pickup area). In

2

FIG. 1, the BLS frame is shown after the bridge has been drawn to raise the island above a top of the BLS frame's sidewalls.

Figure 9:
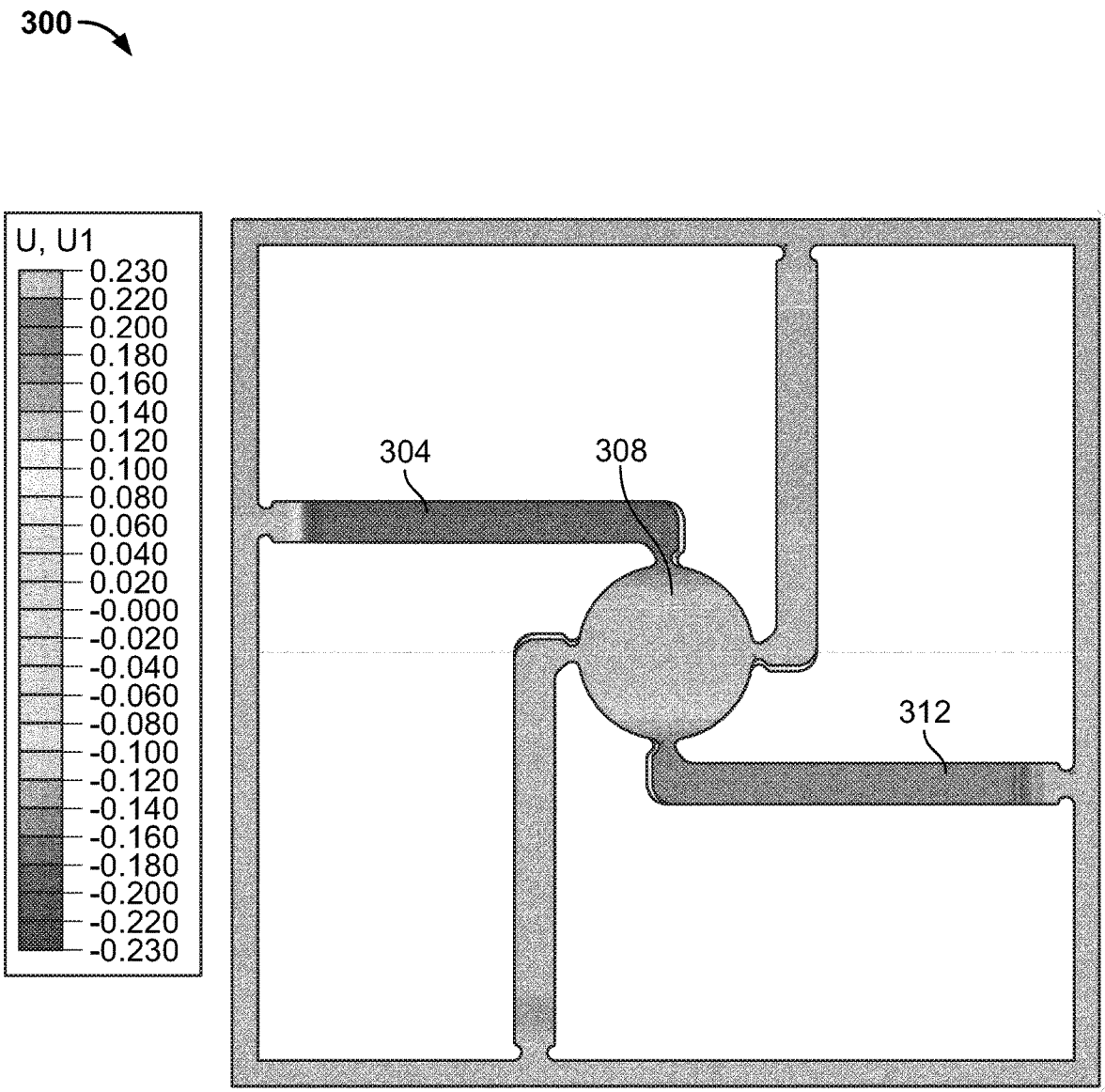
Figure 10:
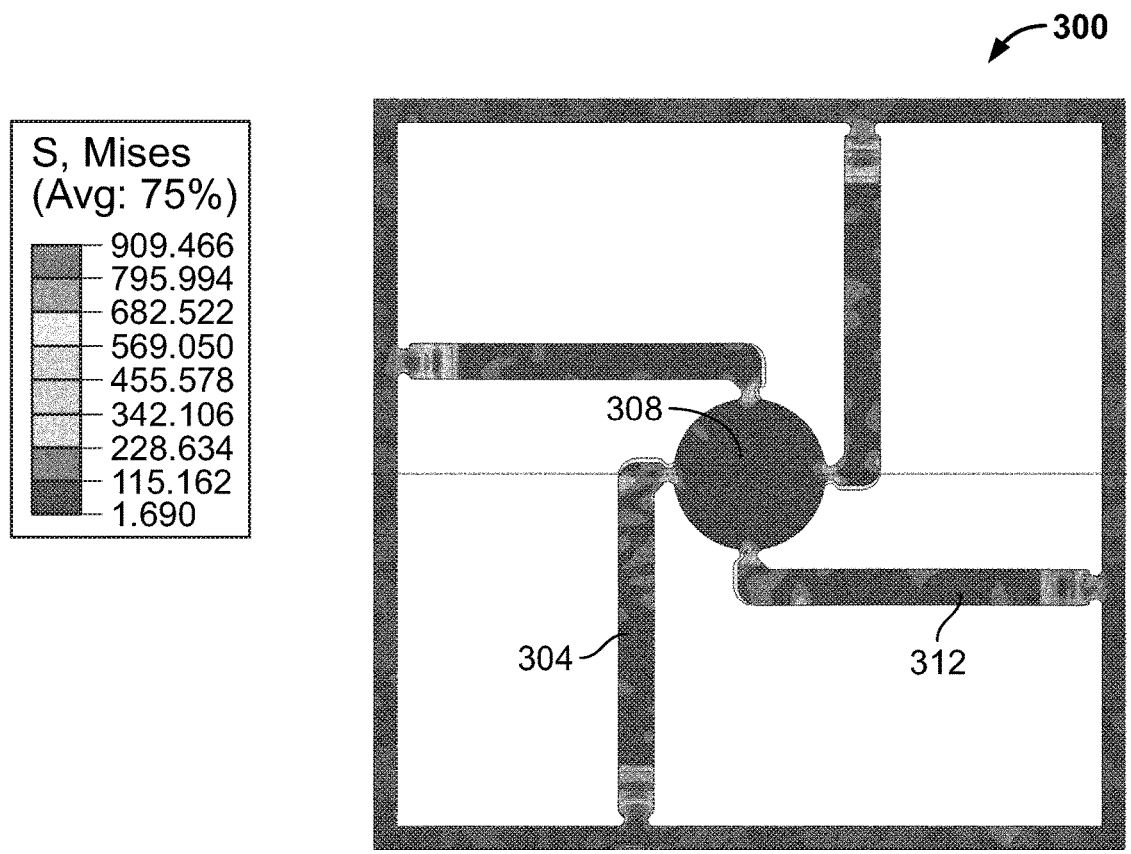
Figure 11:
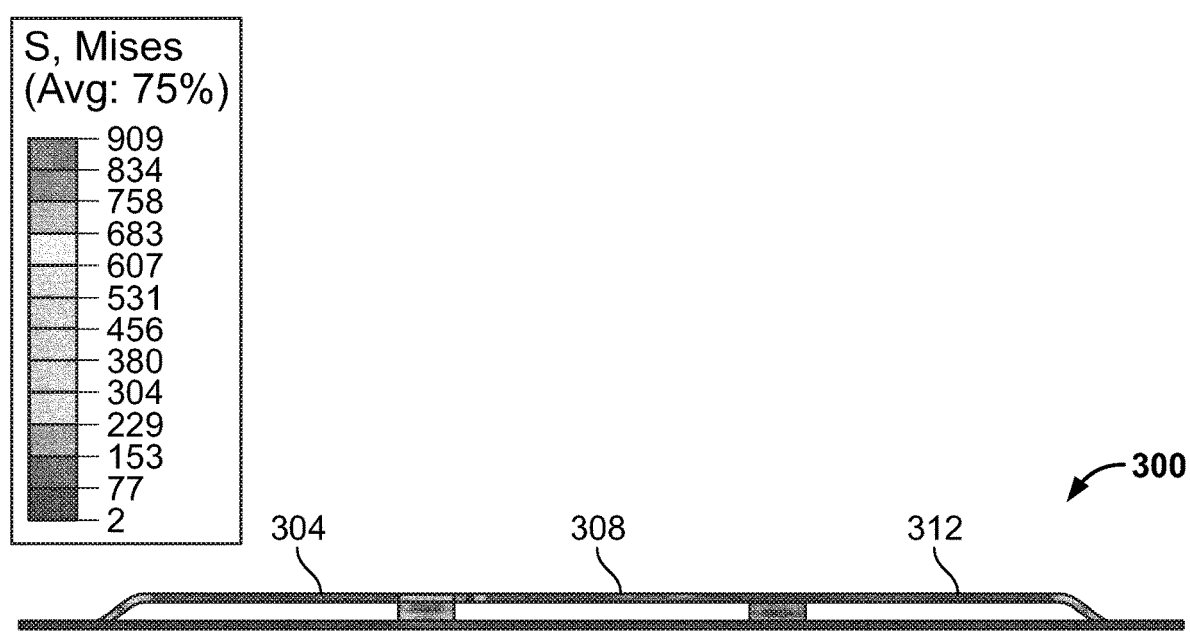

FIGS. 9, 10, and 11 illustrate an exemplary embodiment of a BLS frame or fence that includes a pick and place bridge having a pick and place island. In FIG. 9, U1 refers to displacement in millimeters (mm) along the X axis. In FIGS. 10 and 11, S refers to stress with the type being Von Misses in megapascals (MPa).

Figure 12:
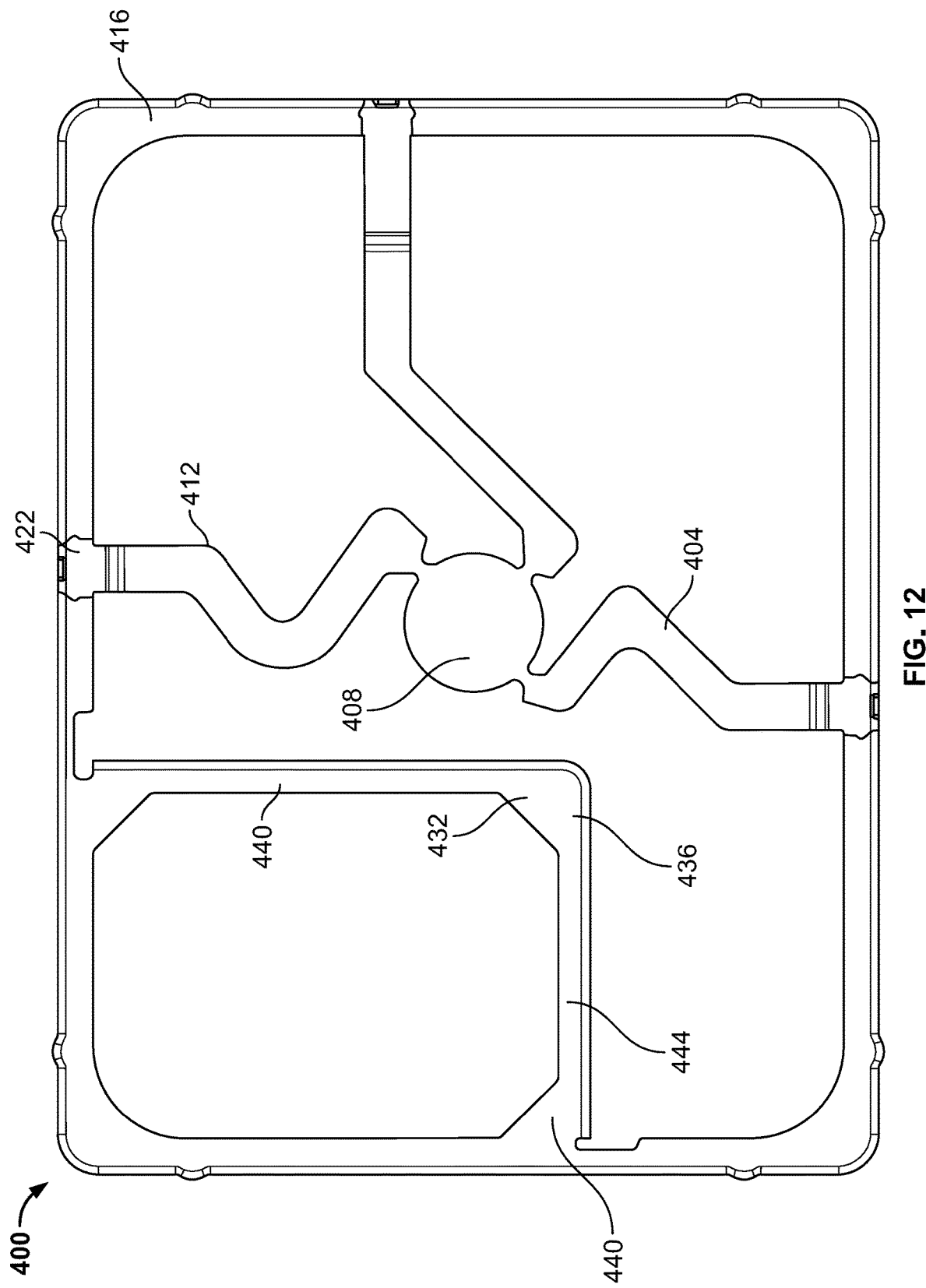

FIG. 12 illustrates an exemplary embodiment of a BLS frame or fence that includes a removable pick and place bridge having a pick and place island with three attachment points.

Corresponding reference numerals indicate corresponding parts throughout the several views of the drawings.

DETAILED DESCRIPTION

Example embodiments will now be described more fully with reference to the accompanying drawings.

Frames or fences of conventional two-piece board level shields are generally made from sheet metal materials that have good formality and stiffness. The ability to add drawn features to BLS frames or fences allows for features like a raised up "pick and place" island. A raised "pick and place" island may advantageously allow for better component clearance during the soldering operation. A raised "pick and place" island may also allow for easier removal of the "pick and place" bridge after soldering. A raised "pick and place" island may further allow for a lower soldered down frame height, which, in turn, may provide a full material thickness advantage.

One of the difficulties encountered when adding a drawn (raised) "pick and place" bridge is that drawing process adds residual stress to the part, which can make meeting co-planarity (flatness) tolerances harder to achieve. Also, this residual stress may potentially cause a soldered down frame to twist out of the desired flat shape and/or potentially cause the frame to lift up off the soldered surface (e.g., substrate or board of a printed circuit board (PCB), etc.) during the reflow solder operation. As disclosed and recognized herein, it would be desirable and provide a design advantage to allow a center island (broadly, a pickup area) of the "pick and place" bridge (broadly, a pickup member) to rotate in place during the drawing process, to thereby reduce the needed elongation of the drawn metal "pick and place" bridge. Reducing the metal elongation will advantageously reduce the residual stress of the part, thus allowing for tighter or superior co-planarity (flatness) tolerances.

Accordingly, disclosed herein are exemplary embodiments of a BLS frame or fence that includes a pick and place bridge (broadly, a pickup member) having a pick and place island (broadly, a pickup area). The island is rotatable in place when the bridge is being drawn to raise the island above a top of the BLS frame's sidewalls. The rotation of the island helps reduce the needed elongation of the drawn material (e.g., drawn metal, etc.). Reducing the material elongation helps reduce the residual stress of the part (e.g., reduces residual stresses of the bridge's arms, island, and bridge-to-island attachments, etc.). The reduction in residual stress allows for superior or tighter co-planarity (flatness) tolerances.

In exemplary embodiments, the bridge-to-island attachments are purposefully offset (e.g., FIG. 8, etc.) so that the island is still generally centered relative to the center of mass and/or to the footprint or perimeter defined by the BLS frame's sidewalls after the island rotation during the drawing process. For example, a bridge-to-island attachment may be configured to have a reduced width as compared to the width of the corresponding bridge arm, leg, or cross member. A bridge-to-island attachment may be configured such that it is planar or in the same plane as the island and the corresponding bridge arm or leg.

The X-Y position of the island relative to the BLS frame's sidewalls may be the same or substantially the same before and after the drawing process as only the Z-position or height of the island relative to the BLS frame's sidewalls significantly changes during the drawing process. In some exemplary embodiments, the bridge includes a circular island having a center that is generally centered or centrally located relative to the center of mass and/or the perimeter or footprint defined by BLS frame's sidewalls both before and after the drawing process. During the drawing process, the island may rotate in place in the X-Y plane without any (or without any significant) translational/linear motion of the center of the island in either the X or Y directions. The x-y position of the island may be unchanged during the drawing process.

In exemplary embodiments, the bridge-to-island attachments are purposefully offset in the tooling when the pickup member or bridge is made. The attachment of the arms/legs may be offset from the centerline of the pickup circle or island. The offset creates a moment from which, when the arm/leg is put under tension, the pickup island is rotated instead of stretching the arm/leg. The pick bridge may be removed after installation of the BLS frame, e.g., after the BLS frame has been soldered to a PCB, etc.

In exemplary embodiments, a majority of the surface of the arms/legs and the center pickup island may be co-planar. A jog (e.g., a Z bend, angled portion, etc.) may be provided in each of the arms/legs, such that the connection point from each arm/leg to the frame may be co-planar with a top of the frame's sidewalls. The jog in each arm/leg (e.g., adjacent the walls of the frame or fence, etc.) creates a secondary plane, which includes the remaining length of each leg along with the center pickup island. The pickup island may be configured to be coplanar with and remain coplanar with the top surface of the arms/legs to help ensure accuracy of the pick and place operation when the BLS frame or fence is placed onto a substrate (e.g., PCB, etc.).

Exemplary embodiments disclosed herein may provide one or more (but not necessarily any or all) of the following features or advantages over some existing board level shields. For example, exemplary embodiments disclosed herein may eliminate the need to stretch or elongate the arms or legs of the pickup bridge when raising the pickup member (e.g., circular pickup island, etc.) during a drawing process. This may allow for reduced residual or forming stresses, which is a benefit to improving flatness capability.

With reference to the figures, FIGS. 1 through 4 illustrate an exemplary embodiment of a frame or fence 100 of a board level shield (BLS) embodying one or more aspects of the present disclosure. As shown, the BLS frame 100 includes a pick and place bridge 104 (broadly, a pickup member) having a pick and place island 108 (broadly, a pickup area) and four arms or legs 112 (broadly, members). Each arm or leg 112 extends generally between a corresponding sidewall 116 (or flange) of the frame 100 to the island 108. An attachment or connection 120 (e.g., fixed connection, removably detachable connection, etc.) is between the island 108 and each arm 112. Another attachment or connection 122 (e.g., fixed connection, removably detachable connection, etc.) is between each arm 112 and the corresponding sidewall 116 of the frame 100.

Figure 1:
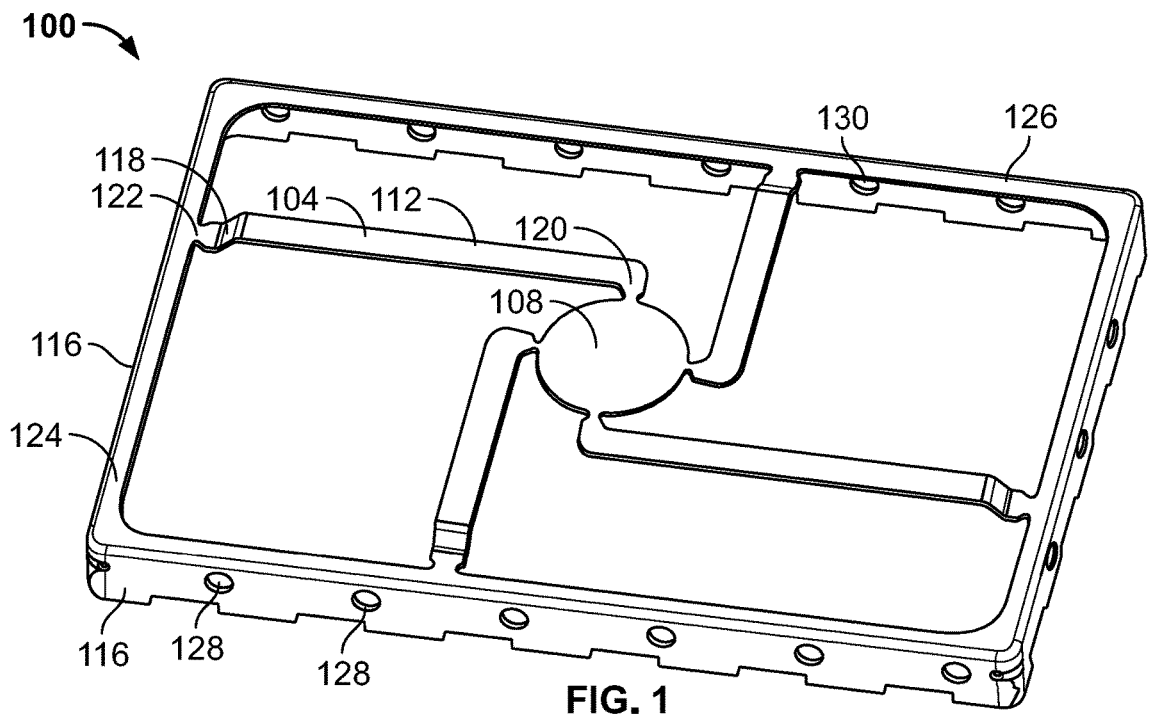
Figure 2:
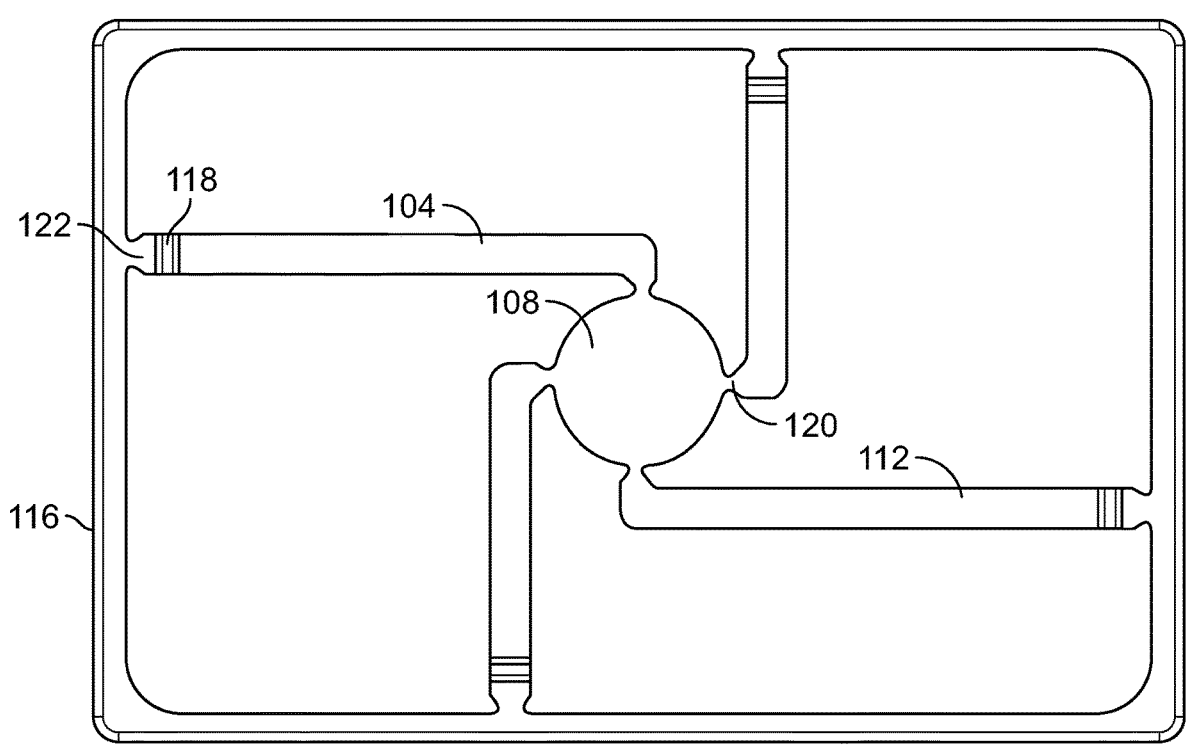
FIG. 2 is a top view of the BLS frame shown in FIG. 1.
Figure 3:
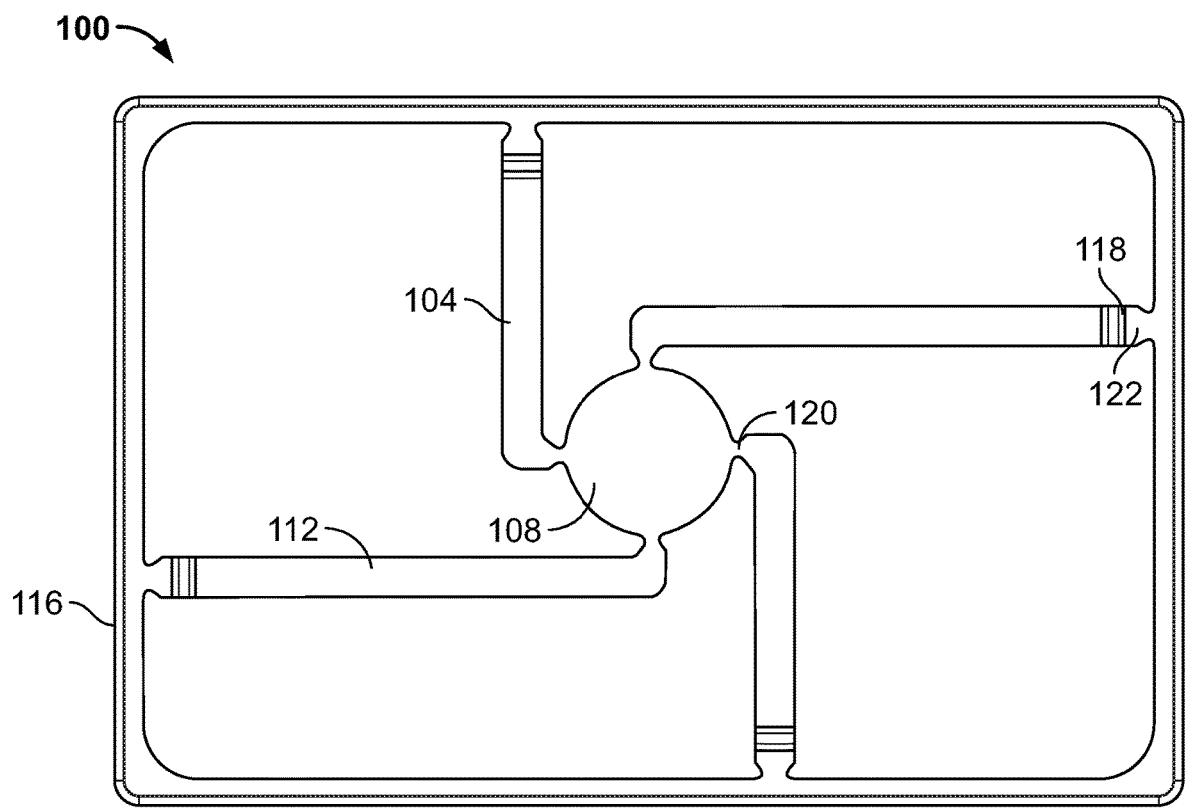
FIG. 3 is a bottom view of the BLS frame shown in FIG. 1.

In FIG. 1, the BLS frame 100 is shown after the bridge 104 has been drawn to raise the island 108 above a top of the BLS frame's sidewalls 116. During the drawing process, the island 108 was allowed to rotate in place with counterclockwise rotation in the X-Y plane without any (or with any significant) translational/linear motion of the center of the island 108 in either the X or Y directions. Accordingly, the x-y position of the island 108 may be unchanged during the drawing process. In this example, the island 108 may be positioned at about the center of mass of the BLS frame 100 before the drawing process. And, the x-y location of the island 108 may remain at about the center of mass of the BLS frame 100 after the island 108 is raised by the drawing process.

Figure 8:
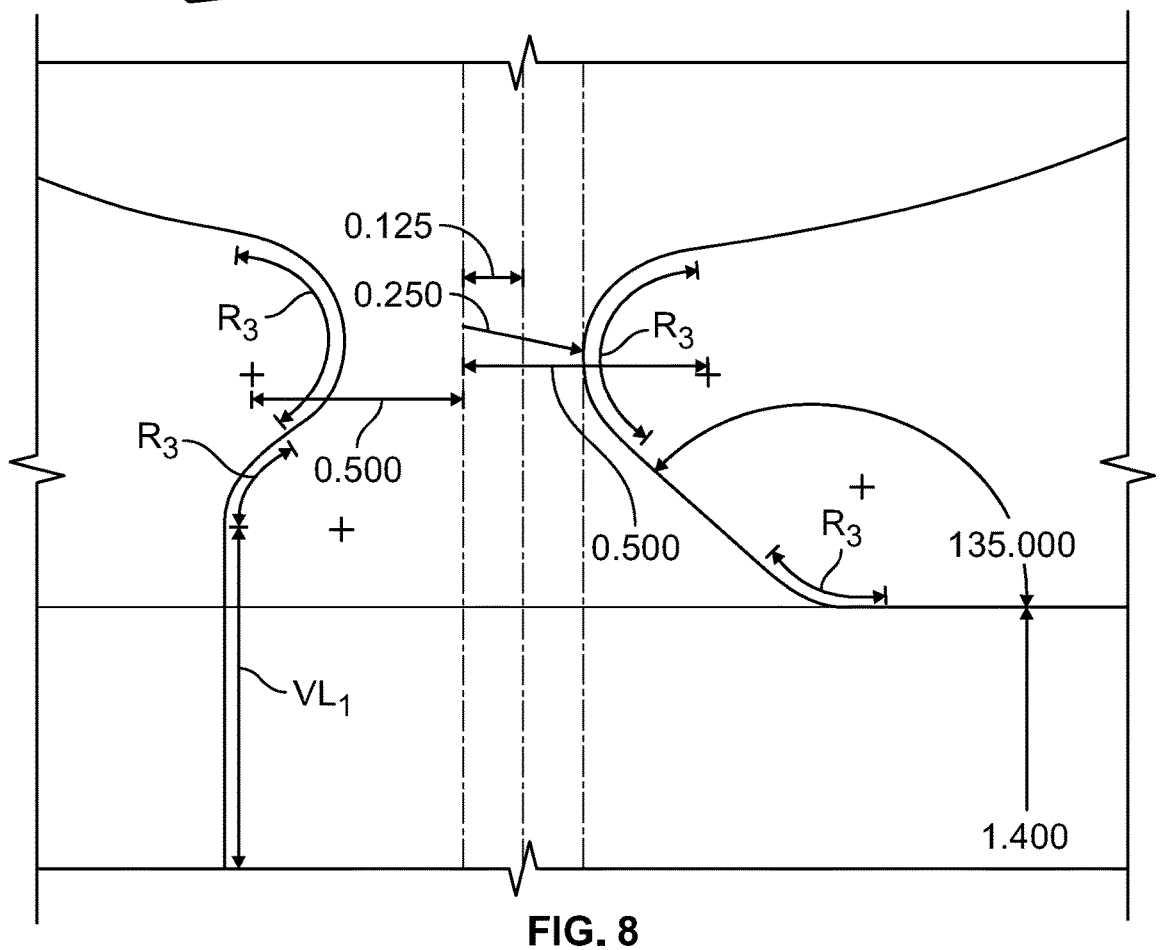
FIG. 8 illustrates an exemplary offset of an arm-to-island attachment of a bridge according to an exemplary embodiment.

The arm-to-island attachments 120 may be offset so that the island 108 is still generally centered relative to the footprint or perimeter defined by the BLS frame's sidewalls 116 after the island rotation during the drawing process. In this example, the attachment of the arms/legs 112 to the island 108 are offset from the centerline of the circular pickup island 108. By being offset, the drawing process creates a moment from which, when the arm/leg 112 is put under tension, the pickup island 108 is rotated instead of stretching the arm/leg 112. By way of example, FIG. 8 shows a starting location of an island attachment that is offset by 0.125 mm from center. The attachments 120 may also have a reduced width as compared to the width of the corresponding arms 112.

Figure 4:
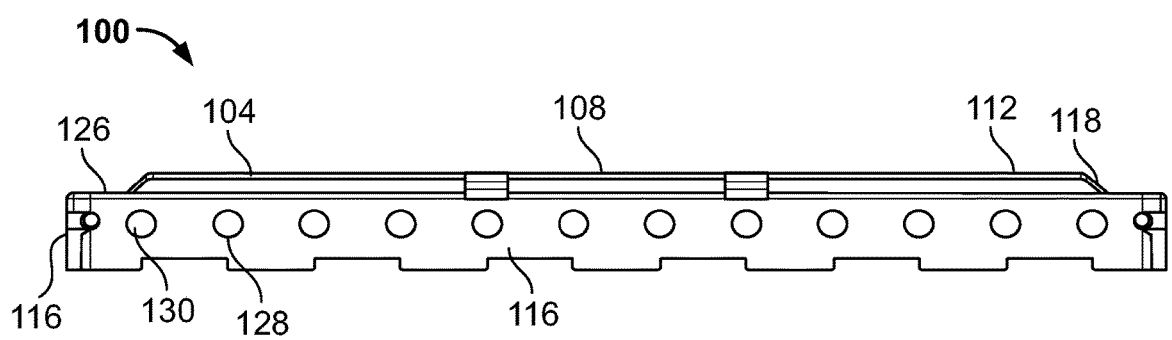
FIG. 4 is a front view of the BLS frame shown in FIG. 1, and showing a relative height of the island to the top of the front wall after the island is raised during the drawing process.

The attachment 120 may be configured such that the material defining the attachments 120 is initially planar or in the same plane as the island 108 and the corresponding bridge arm or leg 112 before drawing the bridge 104 to raise the island 108. A majority of the surface of the arms/legs 112 and the center pickup island 108 may be co-planar. A jog 118 (e.g., a Z bend, upwardly angled or slanted portion, etc.) may be provided in each of the arms/legs 112, such that the connection point 122 from each arm/leg 112 to the frame 100 is co-planar with a top of the frame's sidewalls 116. The jog 118 in each arm/leg 112 (e.g., adjacent the walls of the frame or fence, etc.) creates a secondary plane, which includes the remaining length of each leg 112 along with the pickup island 108. The pickup island 108 may be configured to be coplanar with and remain coplanar with the top surface of the pickup member 104 to help ensure accuracy of the pick and place operation when the BLS frame or fence 100 is placed onto a substrate (e.g., PCB, etc.). As shown in FIG. 4, each jog 118 may comprise a portion that extends upwardly at an angle (e.g., 45 degrees, 60 degrees, other acute angle, etc.) that allows the connection 122 from the corresponding arm/leg 112 to the frame 100 to be co-planar with a top of the frame's sidewalls 116 and that allows the pickup island 108 to be co-planar with the remainder of the corresponding arm/leg 112 that extends between the jog 118 and the pickup island 108.

The X-Y position of the island 108 relative to the BLS frame's sidewalls 116 may be the same or substantially the same before and after the drawing process as only the Z-position or height of the island 108 relative to the BLS frame's sidewalls 116 changes (raised) significantly during the drawing process. In some exemplary embodiments, the island or pickup area 108 is circular with a center that is generally centered or centrally located relative to the perimeter or footprint defined by BLS frame's sidewalls 116 both before and after the drawing process. Alternatively, the pickup area 108 may be configured differently, e.g., have a non-circular shape, a different location, etc.

The island or pickup area 108 is configured (e.g., sized, shaped, located, etc.) to enable the bridge 104 to be picked up by a head associated with pick-and-place equipment, such as by a suction nozzle, gripper, or other pickup features. For example, the pickup area 108 may be configured to allow the frame 100 and bridge 104 to be picked up, moved, and placed onto a PCB with pick-and-place equipment (e.g., vacuum pick-and-place equipment, etc.). The pick-up area 108 may be configured for use as a pick-up area that may be gripped or to which suction may be applied by the pick-and-place equipment for handling during original installation of the frame 100 to a PCB. The pick-up area 108 may be generally centrally located, etc. to allow for balanced manipulation of the frame 100 during handling. In other exemplary embodiments, a frame 100 may also include tabs at corners and/or along the side edges for use as additional pick-up surfaces.

In this illustrated embodiment, the pickup area 108 of the bridge 104 is centrally located, generally flat, and circular. In addition, the bridge 104 includes four arms, legs, cross braces, or cross members 112. The arms/legs 112 are fixedly attached to the sidewalls 116 via connections 122, which in this example comprise necked down or reduced thickness portions to facilitate cutting or severing the connections 122.

The arms 112 are equally spaced apart (e.g., 90 degrees apart, etc.) about the perimeter of the pickup area 108. Each arm 112 may be fixedly attached or releasably attached to a corresponding sidewall 116 of the frame 100. The bridge 104 and the frame's inwardly extending flange, rim, or lip may define four openings or windows. In other exemplary embodiments, there may be more or less openings in different sizes and/or shapes than what is illustrated in the figures.

In some embodiments, the arms 112 of the bridge 104 interconnect the sidewalls 116 and may provide stiffening support to the frame 100, for example, to resist deformation (e.g., bending, etc.) during handling by pick and place automation. Having the arms 112 attached to the sidewalls 116 in this exemplary manner at four different locations 122 provides great stability, helps resists deformation of the frame 100 in the X and Y lateral directions, and/or helps the bridge 104 remain attached to the frame 100 when carried by pick and place equipment. The arms 112 may also be configured to help maintain the side walls 116 in the generally rectangular shape of the frame 100 during such handling and installation to the PCB. In other exemplary embodiments, the arms 112 of the bridge 104 may extend from other locations of the sidewalls 116. Or, the bridge 104 may include more than or less than four arms 112 and/or arms in different orientations and/or arms attached to the sidewalls in more or less than four locations depending, for example, on the frame configuration (e.g., size, shape, mass, etc.). For example, FIG. 12 illustrates an exemplary embodiment of a BLS frame or fence 400 that includes a removable pick and place bridge 404 having a pick and place island 408 with three arms or legs 412 releasably attached via interlocks 422 to the frame's sidewalls 416.

Alternative embodiments may include a bridge having a different configuration, such as a pickup area with a different configuration (e.g., non-circular, offset from center, etc.) and/or differently configured arms (e.g., more or less than four, non-planar, non-flat, etc.) For example, another embodiment may include a bridge releasably attached to a frame where the bridge includes only two arms that extend outwardly from a pickup area to opposing sidewalls of the frame. In this example, the bridge extends between only the pair of opposing sidewalls and not all four sidewalls.

The bridge 104 and frame 100 may be formed from a single piece of electrically-conductive material (e.g., single blank of material, etc.) so that the frame's side walls 116 and bridge 104 have an integral, monolithic construction. A wide range of electrically-conductive materials may be used to form the bridge 104 and frame 100. In an exemplary embodiment, a flat profile pattern for the frame 100 and bridge 104 may be stamped into a piece of material. The frame's sidewalls 116 and bridge 104 may then be formed, bent, drawn, shaped, folded, etc. into the configuration shown in FIGS. 1 through 4. Even though the frame 100 and bridge 104 may be integrally formed (e.g., stamping and bending/folding/drawing, etc.) from the same piece of material substantially simultaneously in this example, such is not required for all embodiments.

The illustrated frame 100 includes an inwardly extending rim, flange, or lip 124 defining the upper surface of the frame 100. But other exemplary embodiments may include a frame with a flangeless construction without an inwardly extending lip, rim, or flange.

With further regard to the frame 100, the four sidewalls 116 are arranged such that the frame 100 is generally rectangular in shape. In other exemplary embodiments, the frame 100 may include more or less than four sidewalls 116 and/or sidewalls in a configuration different from that shown in the figures. For example, the sidewalls 116 may have a square configuration, a triangular configuration, a hexagonal configuration, another polygonal-shaped configuration, a circular configuration, a non-rectangular configuration, etc.

FIG. 4 is a front view of the BLS frame 100 showing the relative height of the island 108 above the top 126 of the front sidewall 116 after the island 108 has been raised during the drawing process. FIG. 4 also shows circular holes 128 and 130 (broadly, openings), respectively, along the front and back sidewalls. The front and back holes 128, 130 may be staggered in this exemplary embodiment such that the holes 130 along the back sidewall 116 would be hidden from view by the front sidewall 116.

The bridge 104 may be removed or detached (e.g., cut, releasably detached, etc.) from the frame 100. A lid or cover may be positioned over the frame 100 to cover the open top of the frame 100. The cover and the frame 100 may be used to enclose and provide EMI shielding for components on a PCB. The lid or cover may include dimples, detents, or protrusions (broadly, portions) configured to be releasably received within the holes 128, 130 along the frame's sidewalls 116 to thereby releasably attach the lid or cover to the BLS frame 100. The lid or cover may be removable from and reattachable to the BLS frame 100. Alternative embodiments may include other means for attaching a lid or cover to a BLS frame.

Figure 5:
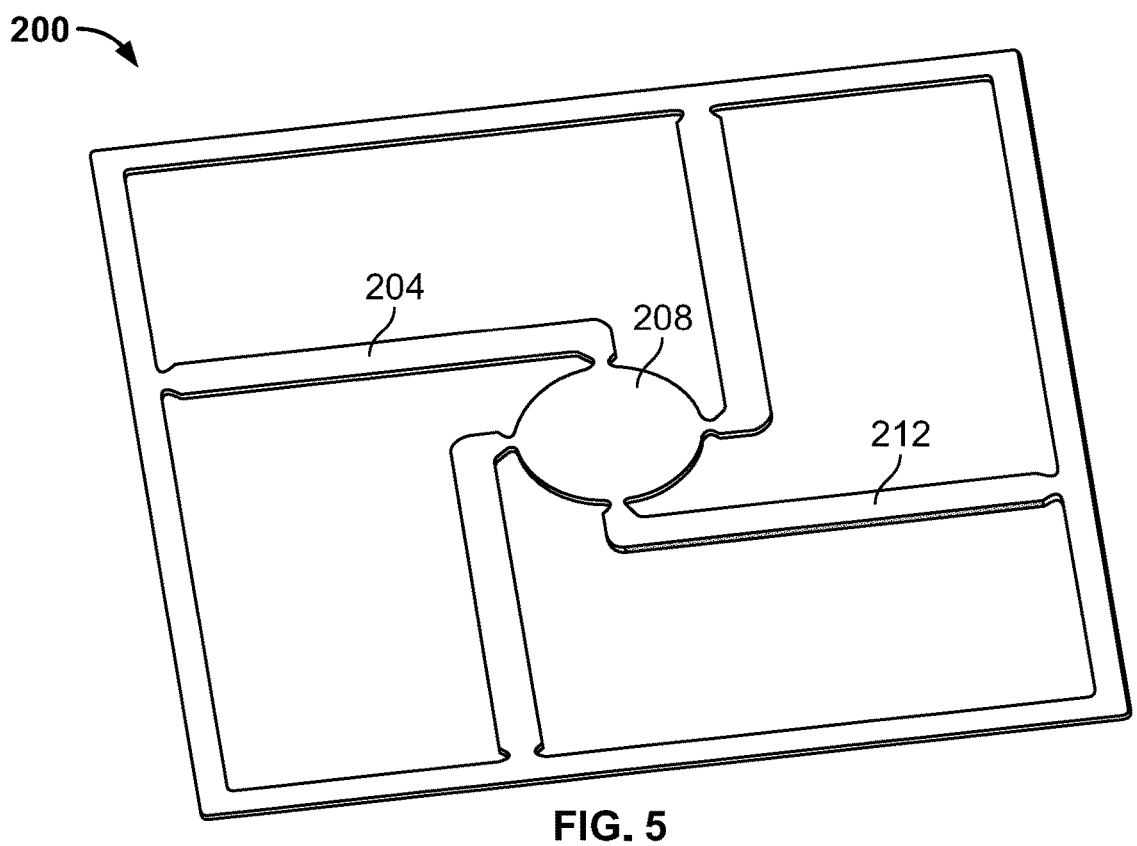
FIG. 5 is a perspective view of an exemplary embodiment of a BLS frame or fence that includes a pick and place bridge having a pick and place island.
Figure 6:
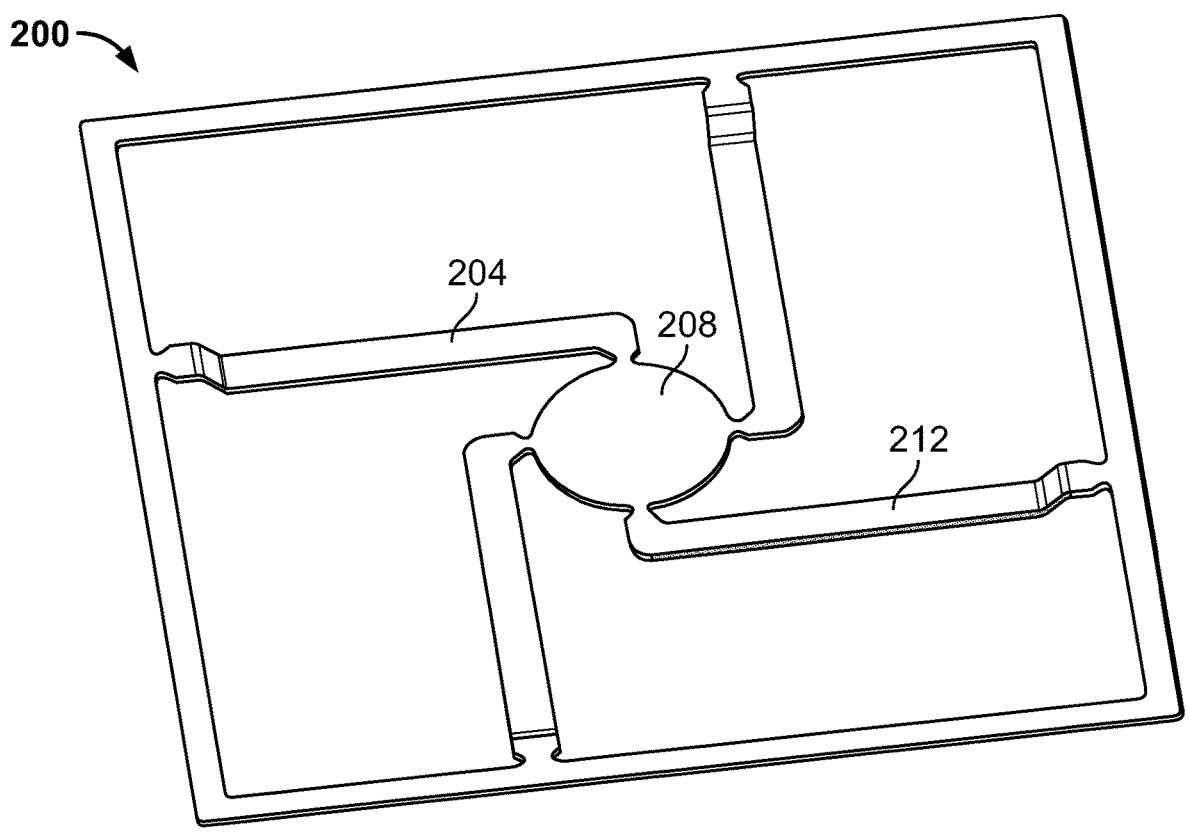
FIG. 6 is a bottom perspective view of the BLS frame shown in FIG. 5 after the bridge has been drawn and the island was allowed to rotate in place.
Figure 7:
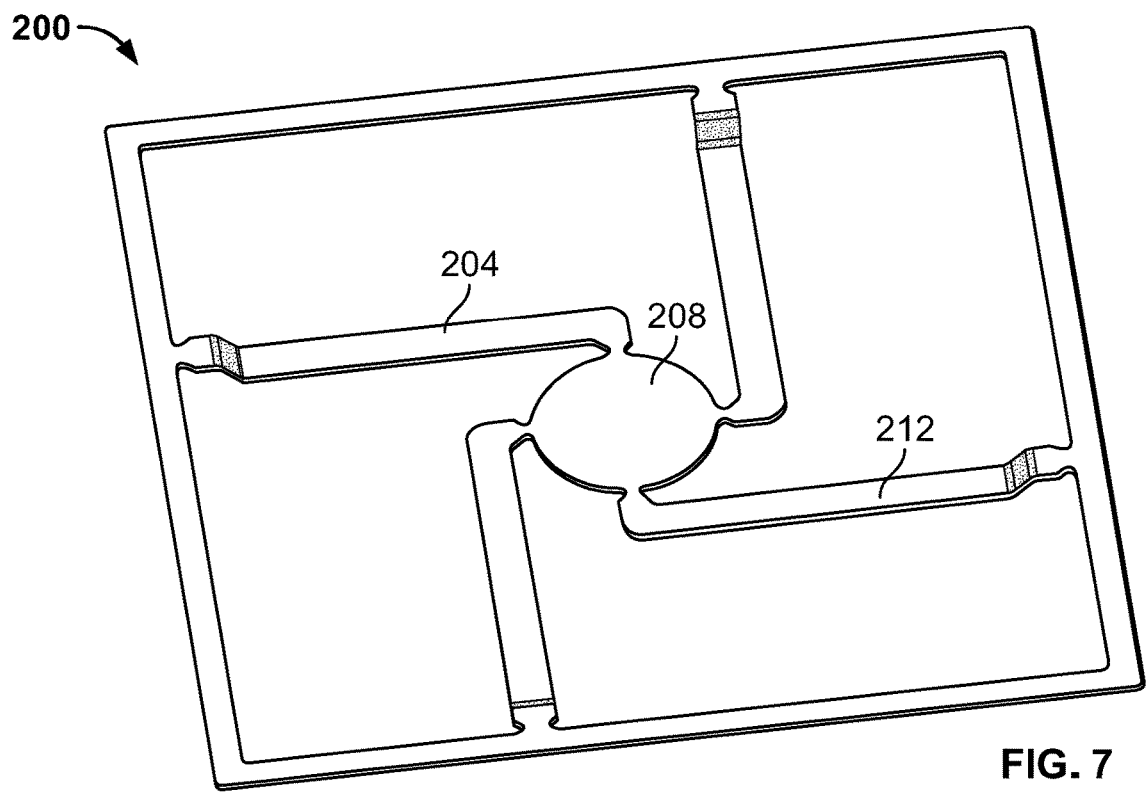
FIG. 7 is a perspective view of the BLS frame shown in FIG. 6.

FIGS. 5, 6, and 7 illustrate an exemplary embodiment of a BLS frame or fence 200 that includes a pick and place bridge 204 (broadly, a pickup member) having a pick and place island 208 (broadly, a pickup area). FIG. 5 shows the frame 200 before the bridge 204 has been drawn to raise to island 208. FIG. 6 shows the BLS frame 200 after the bridge 204 has been drawn and the island 208 was raised and allowed to rotate in place (e.g., counterclockwise rotation in the X-Y plane without any translational linear motion of the center of the island in either the X or Y directions, etc.) during the drawing process.

By way of example only, the length of a bridge arm 212 (broadly, member) shown in FIGS. 5 and 6 may be 13.1928 millimeters (mm) and 13.4548 mm, respectively, before and after the drawing process. Also by way of example only, the exemplary draw shown in FIG. 7 may be 0.7 mm.

FIG. 8 illustrates an exemplary offset of an arm-to-island attachment of a bridge according to an exemplary embodiment. By way of example, FIG. 8 shows a starting location of the island attachment point that is offset by 0.125 mm from center. FIG. 8 also shows the reduced width of the arm-to-island attachment as compared to the arm width. This attachment of the arms/legs are offset from the centerline of the circular pickup island circle. By being offset, the drawing process creates a moment from which, when the arm/leg is put under tension, the pickup island is rotated instead of stretching the arm/leg. The dimensions show in FIG. 8 and other dimensions are example in nature and do not limit the scope of the present disclosure.

FIGS. 9, 10, and 11 illustrate an exemplary embodiment of a BLS frame or fence 300 that includes a pick and place bridge 304 (broadly, a pickup member) having a pick and place island 308 (broadly, a pickup area) and four arms or legs 312 (broadly, members). The bridge 304 has been drawn and the island 308 was allowed to rotate in place with counterclockwise rotation in the X-Y plane without any (or without any significant) translational linear motion of the center of the island 308 in either the X or Y directions.

In FIG. 9, U refers to displacement in millimeters (mm) with the U1, U2, etc. corresponding to different axes. U1 corresponds to the x axis. FIG. 9 shows positive displacement of the lower horizontal leg, and negative displacement of the upper horizontal leg. FIG. 9 also shows that the location of the center of the pickup area 308 doesn't change. Advantageously, this allows for predictable movement—or lack thereof—of the pickup area 308 after the bridge 304 is formed (e.g., drawn, etc.) to the raised position.

In FIGS. 10 and 11, S refers to stress with the type being Von Misses in megapascals (MPa). As shown, there is relatively low residual stress after the bridge 304 is formed (e.g., drawn, etc.) to the raised position. This positively impacts the ability to hold flatness and dimensional tolerances on the overall BLS frame 100.

FIG. 12 illustrates an exemplary embodiment of a BLS frame or fence 400 that includes a removable pick and place bridge 404 (broadly, a pickup member) having a pick and place island 408 (broadly, a pickup area) and three arms or legs 412 (broadly, members). The arms or legs 412 are releasably attached to the frame's sidewalls 416 via interlocks 422.

The BLS frame 400 includes a rigid corner feature or reinforcement 432 at or along the internal corner 436, which improves co-planarity and rigidity. Flanges 440 were added to the other bent areas of these internal walls 444 to improve rigidity as well.

To position the pickup area or island 408 close to or at about close the center of the BLS frame 400, the three attachment points 422 were positioned accordingly. And, the legs 412 were configured to be non-linear (e.g., angled, slanted, curved, etc.) to help inhibit additional stress on the pick bridge legs 412, which might otherwise cause warpage during manufacturing that would affect overall dimensions. In this exemplary embodiment, each of the three legs 412 defined a non-linear or angled pathway from the corresponding frame sidewall 416 to the pickup area or island 408. And, each non-linear or angled pathway of one leg 412 was different than the non-linear or angled pathway defined by the other two legs.

The features of the BLS frame 400 may allow for improved manufacturability and performance as far as co-planarity, rigidity are concerned, and experience less stress/deformation during forming as compared to conventional board level shields. It can be challenging to produce conventional multi-compartment shields with co-planarity to match the outer frame of the shield. Low height requirements and removable pick bridges can further complicate the design and challenge of manufacturing these features.

Results from a finite element analysis (FEA) are provided for purpose of illustration only as other exemplary embodiments may be configured differently, e.g., with a differently configured pick and place bridge, with more or less than four bridge arms, with a non-circular pick and place island, with a non-centered pick and place island, with a non-rectangular BLS, have different residual stresses after or during the drawing process, etc. For an example finite element analysis (FEA) showing (Von) Mises stresses on a pick and place bridge (broadly, a pickup member) during a drawing process, the bridge included a pick and place island (broadly, a pickup area) that was allowed to rotate in place during the drawing process (e.g., with counterclockwise rotation in the X-Y plane without any (or with any significant) translational/linear motion of the center of the island in either the X or Y directions, etc.).

By way of example only, the FEA modeling included the following conditions or parameters. The material was ½ hard 770 Nickel Silver with a thickness of 0.2 millimeters (mm). The draw depth was 0.7 mm at 45 degree angle. The BLS flange width was 1 mm. The bridge arm width was 1.4 mm. The BLS length was 30 mm. Friction was assumed to be low and was set to 0.1. The BLS flange was pinned down on all four sides for holding the material in place, thereby simulating bent walls and/or pressure pads.

By way of example only, CAD Modeling (FIGS. 5 through 8) predicted that the change in arm length for the 0.7 mm draw (at 45 degrees) was 0.262 mm. The length of the illustrated bridge arm 212 before the draw was 13.1928 mm. The length of the illustrated bridge arm 212 after the draw was 13.4548 mm. Accordingly, the difference in length before and after the draw was about 0.262 mm. Dividing the change in length 0.262 mm in half (or dividing by two) and then rounding to an even number predicted the starting location of each island attachment point. In an exemplary embodiment, the predicted starting location of each island attachment point was about 0.125 mm from the center of the circular pick up area or island (FIG. 8).

The FEA analysis predicted that allowing the center island to rotate (e.g., using rotating cam connections, etc.) will allow the arms to move 0.175 mm. Therefore, the change in length (of the drawn arms) is reduced by 0.087 mm (material elongation, as calculated by 0.262 mm−0.175 mm=0.087 mm). This is about a two-thirds reduction in arm material elongation, which reduction will reduce the residual stress on the part.

In some exemplary embodiments, the pickup member or bridge may be releasably attached to the frame. After the bridge is removed or detached from the frame, a lid or cover may be positioned over the frame to cover the open top of the frame. At which point, the cover and the frame may be used to enclose and provide EMI shielding for components on a PCB.

By way of example, the pickup member (e.g., pickup member 404 in FIG. 12, etc.) may detachable and completely separable from the frame without having to deform or cut the frame after the frame is installed (e.g., soldered, etc.) on a substrate such that the frame remains installed on the substrate without the pickup member. Each arm of the pickup member may be releasably attached to the corresponding sidewalls of the frame by an interlock. The interlock may comprise a first interlocking member integrally defined by an arm of the pickup member and downwardly depending relative to an end portion of the arm. The interlock may further comprise a second interlocking member integrally defined by the corresponding sidewall of the frame and upwardly protruding relative to the first interlocking member. The interlock may also comprise an opening to accommodate movement of the first interlocking member inwardly relative to the opening, thereby allowing continued upward movement of the first interlocking member relative to the second interlocking member for disengaging the interlock. Disengagement of the interlock between each arm and the corresponding sidewall of the frame allows the pickup member to be detached and completely separated from the frame. The pickup member may be releasably attached to the frame such that the pickup member is detachable and completely separable from the frame by moving the pickup member relatively away from the frame and/or without requiring any cutting, shearing, or distortion of the frame or pickup member. The releasable attachment of the pickup member and the frame is within the footprint of the frame. The pickup member and the frame may be integrally formed substantially simultaneously from a single blank of material with an interface formed between the pickup member and the frame such that the pickup member is a detachable and completely separable part from the frame. A BLS cover may be made from a different piece of material than the single blank of material from which the pickup member and the frame are integrally formed. The cover may be only attachable to the frame after the pickup member is removed from the frame. The pickup area may be a generally flat pickup area that enables the pickup member, and frame releasably attached thereto, to be picked up by a suction nozzle or gripper associated with pick-and-place equipment. End portions of the arms may be bent or angled upwardly after being drawn so as to position the pickup area higher than the upper surface of the frame. The higher positioning of the pickup area may allow the frame and the pickup member to be placed over taller electronic components without the taller components contacting the pickup area. The frame may include flanges or it may have a flangeless construction. The pickup member may allow the pickup member and the frame to be picked up with pick-and-place equipment, and to allow the pickup member to be detached and completely separated from the frame using pick-and-place after the frame is installed to the substrate. Additional embossing or crimping operations may be performed across the juncture or interface contact between the frame and the pickup member or bridge to help ensure retention of the frame to the bridge, for example, during handling, packaging, pick and place operations, and/or customer installation/solder reflow, etc. In some exemplary embodiments, the pickup member may be releasably attached to the frame as disclosed in U.S. Patent Application Publication U.S. 2013/0033843, which is incorporated herein by reference.

In some exemplary embodiments, the bridge and frame may be formed by a combination of fabricating processes including drawing over a die, and then folding or bending part of the frame to produce the final desired shape. In such embodiments, the frame may include corner sections having drawn portions and folded portions as disclosed in U.S. Pat. No. 7,488,902, which is incorporated herein by reference.

In an exemplary embodiment, a method generally includes raising a pickup area of a pickup member attached to a frame of a board level shield (BLS) relative to an upper surface of one or more sidewalls of the frame, such that the pickup area rotates in place as the pickup area is raised relative to the upper surface of the one or more sidewalls.

Raising the pickup area may comprise rotating the pickup area in a plane such that a height of the pickup area in a first direction perpendicular to the plane is increased relative to the upper surface of the one or more sidewalls without substantially changing a location of the pickup area in a direction parallel the plane. Raising the pickup area may comprise rotating the pickup area in an X-Y plane such that the pickup area is moved in a Z direction relative to the upper surface of the one or more sidewalls without substantially moving the pickup area in either the X or Y directions. Rotating the pickup area comprises clockwise or counterclockwise rotation of the pickup area about an axis without any translational motion of the pickup area in a direction perpendicular to the axis.

The rotation of the pickup area in place as the pickup area is raised relative to the upper surface of the one or more sidewalls may reduce needed elongation of the pickup member and may reduce residual and/or forming stresses.

Raising the pickup area may comprise forming the pickup member to thereby reshape the pickup member without adding or removing material.

Raising the pickup area may comprise drawing the pickup member.

The attachment of the pickup area to the pickup member may be offset from a centerline of the pickup area such that the pickup area is generally centered relative to a center of mass of the frame and/or to a footprint defined by the one or more sidewalls both before and after the raising and rotation in place of the pickup area.

The pickup member may include one or more arms each extending generally between the pickup member and a corresponding one of the one or more sidewalls of the frame.

The pickup member may be configured such that the pickup area is generally centered relative to a center of mass of the frame and/or to a footprint defined by the one or more sidewalls both before and after the raising and rotation in place of the pickup area.

Raising the pickup area may include forming a portion in each of the one or more arms that extends upwardly at an angle between a connection of the corresponding arm to the frame such that the pickup area is higher than the one or more sidewalls of the frame thereby providing greater clearance for components under the pickup area, whereby the portion allows an upper surface of the arm between the connection and the pickup area to be substantially co-planar with an upper surface of the pickup member and allows the connection to be substantially co-planar with an upper surface of the one or more sidewalls.

Raising the pickup area may comprise maintaining co-planarity of an upper surface of the pickup area with an upper surface of the one or more arms before and after raising the raising and rotation in place of the pickup area.

An attachment between each of the one or more arms and the pickup area may be offset from a centerline of the pickup area. The offset may be configured to create a moment from which, when the arm is put under tension during the raising of the pickup area, the pickup area is rotated instead of elongating the arm.

The one or more sidewalls of the frame may comprise four sidewalls. The one or more arms may comprise three arms each extending between a corresponding one of the four sidewalls and the pickup area, or four arms each extending between a corresponding one of the four sidewalls and the pickup area.

The one or more arms may be releasably attached to the one or more sidewalls by one or more interlocks. The frame may include one or more internal walls, reinforcement along an internal corner defined by the one or more internal walls, and flanges along the one or more internal walls. The one or more arms may be non-linear.

The method may further comprise picking up the frame by the pickup member attached to the frame and placing the frame on a substrate for installation to the substrate generally about one or more components on the substrate to be shielded; removing the pickup member from the frame after raising the pickup area; and attaching a cover to the frame, whereby the frame and cover are operable for shielding the one or more components on the substrate that are within an interior cooperatively defined by the frame and the cover.

The pickup member may be integrally formed with and fixedly attached to the frame. Or, the pickup member may be integrally formed with and removably attached to the frame, and removing the pickup member from the frame comprises using pick-in-place equipment to move the pickup member relatively away from the frame without cutting, shearing, or breaking of material integrally forming the pickup member and frame.

In an exemplary embodiment, a shielding apparatus generally includes a frame and a pickup member. The frame includes one or more sidewalls configured for installation to a substrate generally about one or more components on the substrate. The pickup member includes a pickup area. The pickup area is rotatable in place when the pickup area is raised relative to an upper surface of the one or more sidewalls.

The pickup member may include one or more arms each extending generally between the pickup member and a corresponding one of the one or more sidewalls of the frame. A connection between each of the one or more arms and the pickup area may be offset from a centerline of the pickup area. The offset may be configured to create a moment from which, when the corresponding arm is put under tension during the raising of the pickup area, the pickup area is rotated instead of elongating the arm.

The pickup member may be configured such that the pickup area is generally centered relative to a center of mass of the frame and/or to a footprint defined by the one or more sidewalls both before and after the pickup area is raised and rotated in place. The pickup member may be configured such that co-planarity is maintained for an upper surface of the pickup area with an upper surface of the one or more arms before and after the pickup area is raised and rotated in place.

The pickup member may be configured such that a portion in each of the one or more arms extends upwardly at an angle between the connection of the corresponding arm to the frame after the pickup area is raised and rotated in place such that the pickup area higher than the one or more sidewalls of the frame thereby providing greater clearance for components under the pickup area. The portion may allow an upper surface of the arm between the connection and the pickup area to be substantially co-planar with an upper surface of the pickup member and may allow the connection to be substantially co-planar with an upper surface of the one or more sidewalls.

The one or more sidewalls of the frame may comprise four sidewalls. The one or more arms may comprise three arms each extending between a corresponding one of the four sidewalls and the pickup area, or four arms each extending between a corresponding one of the four sidewalls and the pickup area.

The one or more arms may be releasably attached to the one or more sidewalls by one or more interlocks. The frame may include one or more internal walls, reinforcement along an internal corner defined by the one or more internal walls, and flanges along the one or more internal walls. The one or more arms may be non-linear.

The pickup member may be integrally formed with and fixedly attached to the frame. Or, the pickup member may be integrally formed with and releasably detachable from the frame, such that the pickup member is detachable and completely separable from the frame without cutting, shearing, or breaking of material integrally forming the pickup member and the frame.

The pickup member may be configured such that the pickup area is rotatable in a plane such that a height of the pickup area in a first direction perpendicular to the plane is increasable relative to the upper surface of the one or more sidewalls without substantially changing a location of the pickup area in a direction parallel the plane.

The pickup member may be configured such that the pickup area is rotatable in an X-Y plane such that the pickup area is movable in a Z direction relative to the upper surface of the one or more sidewalls without substantially moving the pickup area in either the X or Y directions.

The pickup member may be configured such that the pickup area is rotatable clockwise or counterclockwise about an axis without any translational motion of the pickup area in a direction perpendicular to the axis.

The pickup member may be configured such that rotation of the pickup area in place as the pickup area is raised relative to the upper surface of the one or more sidewalls may reduce needed elongation of the pickup member and may reduce residual and/or forming stresses.

The attachment of the pickup area to the pickup member may be offset from a centerline of the pickup area such that the pickup area is generally centered relative to a center of mass of the frame and/or to a footprint defined by the one or more sidewalls both before and after the pickup area is raised and rotated in place.

A board level shield may include the frame, the pickup member, and a cover. The cover may be releasably detachable from and reattachable to the frame after removal of the pickup member. The frame and the cover may be operable for shielding the one or more components on the substrate that are within an interior cooperatively defined by the frame and the cover.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method comprising raising a pickup area of a pickup member including one or more arms extending between the pickup area and one or more sidewalls of a frame of a board level shield (BLS), such that the pickup area is raised relative to and above an upper surface of the one or more sidewalls of the frame, and such that the pickup area rotates in place as the pickup area is raised relative to and above the upper surface of the one or more sidewalls, wherein raising the pickup area comprises rotating the pickup area in an X-Y plane such that the pickup area is moved in a Z direction relative to the upper surface of the one or more sidewalls without moving a location of the pickup area in either the X or Y directions.

2. A method comprising raising a pickup area of a pickup member including one or more arms extending between the pickup area and one or more sidewalls of a frame of a board level shield (BLS), such that the pickup area is raised relative to and above an upper surface of the one or more sidewalls of the frame, and such that the pickup area rotates in place as the pickup area is raised relative to and above the upper surface of the one or more sidewalls, wherein raising the pickup area comprises rotating the pickup area in a plane such that a height of the pickup area in a first direction perpendicular to the plane is increased relative to the upper surface of the one or more sidewalls without changing a location of the pickup area in a direction parallel the plane.

3. The method of claim 1, wherein rotating the pickup area comprises clockwise or counterclockwise rotation of the pickup area about an axis without any translational motion of the pickup area in a direction parallel to the clockwise or counterclockwise rotation.

4. The method of claim 2, wherein rotating the pickup area comprises clockwise or counterclockwise rotation of the pickup area about an axis without any translational motion of the pickup area in a direction parallel to the clockwise or counterclockwise rotation.

5. The method of claim 1, wherein:
an attachment between each said arm and the pickup area is offset from a centerline of the pickup area; and
raising the pickup area includes rotating the pickup area in place as the pickup area is raised relative to and above the upper surface of the one or more sidewalls, whereby the offset creates a moment from which, when the corresponding arm is put under tension during the raising of the pickup area, the pickup area is rotated instead of elongating the arm.

6. The method of claim 1, wherein raising the pickup area comprises forming the pickup member to thereby reshape the pickup member without adding or removing material.

7. The method of claim 1, wherein the pickup member is configured such that the pickup area is centered relative to a center of mass of the frame both before and after the raising and rotation of the pickup area.

8. The method of claim 1, wherein the pickup area is attached to the pickup member, and wherein the attachment of the pickup area to the pickup member is offset from a centerline of the pickup area such that the pickup area is centered relative to a center of mass of the frame both before and after the raising and rotation of the pickup area.

9. The method of claim 1, wherein raising the pickup area includes forming a portion in each of the one or more arms that extends upwardly at an angle between a connection of the corresponding arm to the frame such that the pickup area is higher than the one or more sidewalls of the frame thereby providing greater clearance for components under the pickup area, whereby the portion allows an upper surface of the arm between the connection and the pickup area to be co-planar with an upper surface of the pickup member and allows the connection to be co-planar with an upper surface of the one or more sidewalls.

10. The method of claim 1, wherein an attachment between each of the one or more arms and the pickup area is offset from a centerline of the pickup area.

11. The method of claim 10, wherein the offset is configured to create a moment from which, when the arm is put under tension during the raising of the pickup area, the pickup area is rotated instead of elongating the arm.

12. The method of claim 1, wherein:
the one or more sidewalls of the frame comprise four sidewalls, and
the one or more arms comprise:
three arms each extending between a corresponding one of the four sidewalls and the pickup area, or
four arms each extending between a corresponding one of the four sidewalls and the pickup area.

13. The method of claim 1, further comprising:
picking up the frame by the pickup member attached to the frame and placing the frame on a substrate for installation to the substrate about one or more components on the substrate to be shielded;
removing the pickup member from the frame after raising the pickup area; and
attaching a cover to the frame, whereby the frame and cover are operable for shielding the one or more components on the substrate that are within an interior cooperatively defined by the frame and the cover, and wherein:
the pickup member is integrally formed with and fixedly attached to the frame; or
the pickup member is integrally formed with and removably attached to the frame, and removing the pickup member from the frame comprises using pick-in-place equipment to move the pickup member relatively away from the frame without cutting, shearing, or breaking of material integrally forming the pickup member and frame.

14. The method of claim 1, wherein raising the pickup area comprises drawing the pickup member.

15. The method of claim 1, wherein:
the one or more sidewalls comprise a plurality of sidewalls defining a footprint;
the pickup area is attached to the pickup member; and
the attachment of the pickup area to the pickup member is offset from a centerline of the pickup area such that the pickup area is centered relative to the footprint defined by the plurality of sidewalls both before and after the raising and rotation of the pickup area.

16. The method of claim 1, wherein raising the pickup area comprises maintaining co-planarity of an upper surface of the pickup area with an upper surface of the one or more arms before and after raising the raising and rotation of the pickup area.

17. The method of claim 1, wherein the one or more arms are releasably attached to the one or more sidewalls by one or more interlocks.

18. The method of claim 1, wherein the frame includes one or more internal walls, reinforcement along an internal corner defined by the one or more internal walls, and flanges along the one or more internal walls.

19. The method of claim 1, wherein the one or more arms are non-linear.

* * * * *